(12) United States Patent
Kinoshita et al.

(10) Patent No.: US 7,915,810 B2
(45) Date of Patent: Mar. 29, 2011

(54) DISPLAY DEVICE, AND METHOD FOR REPAIRING A DEFECTIVE PIXEL

(75) Inventors: Masaru Kinoshita, Kanagawa (JP); Tasuku Satou, Kanagawa (JP)

(73) Assignee: Fujifilm Corporation, Tokyo (JP)

( * ) Notice: Subject to any disclaimer, the term of this patent is extended or adjusted under 35 U.S.C. 154(b) by 315 days.

(21) Appl. No.: 12/173,591

(22) Filed: Jul. 15, 2008

(65) Prior Publication Data

US 2009/0021156 A1    Jan. 22, 2009

(30) Foreign Application Priority Data

Jul. 20, 2007   (JP) ................................. 2007-189964

(51) Int. Cl.
*G02F 1/00* (2006.01)
*G02F 1/061* (2006.01)
*H01J 9/50* (2006.01)

(52) U.S. Cl. ............. 313/504; 313/500; 445/2; 349/192

(58) Field of Classification Search .................. 313/504, 313/506, 512; 445/2
See application file for complete search history.

(56) References Cited

U.S. PATENT DOCUMENTS

| 6,097,462 A | * | 8/2000 | Koe | ............................... 349/123 |
| 2004/0179028 A1 | * | 9/2004 | Arai | ............................... 345/690 |
| 2005/0018100 A1 | * | 1/2005 | Chen et al. | ....................... 349/54 |

FOREIGN PATENT DOCUMENTS

| JP | 11-162637 A | 6/1999 |
| JP | 2003-15549 A | 1/2003 |
| JP | 2005-92154 A | 4/2005 |
| JP | 2006-323032 A | 11/2006 |
| JP | 2007-42498 A | 2/2007 |

* cited by examiner

*Primary Examiner* — Karabi Guharay
(74) *Attorney, Agent, or Firm* — Birch, Stewart, Kolasch & Birch, LLP (57) ABSTRACT

A display device 10 including a supporting substrate 12, pixels arranged over the supporting substrate, and a member which is arranged on the light extraction side of a defective pixel 22b, the defective pixel being in a constantly non-lit state, the member being imparted with a light scattering property by the selective application of external energy. Preferably, disposed is a thermosensitive layer 24 which changes from a transparent state to a light scattering state when the layer is heated to a specified temperature or higher. An examination is performed for specifying the constantly non-lit defective pixel from among the pixels arranged over the supporting substrate. An external energy is selectively applied to at least one member arranged on the light extraction side of the defective pixel specified by the examination, thereby imparting the light scattering property to the member.

10 Claims, 4 Drawing Sheets

DISPLAY DEVICE, AND METHOD FOR REPAIRING A DEFECTIVE PIXEL

CROSS REFERENCE TO RELATED APPLICATION

This application claims priority under 35USC 119 from Japanese Patent Application No. 2007-189964, the disclosure of which is incorporated herein by reference.

BACKGROUND OF THE INVENTION

1. Field of the Invention

The invention relates to a display device, and a method for repairing a defective pixel, in particular, a method capable of repairing a defective pixel easily even if the pixel is in a constantly non-lit state.

2. Description of the Related Art

In recent years, organic EL display devices have been developed wherein pixels are made of organic EL elements (organic electroluminescence elements). Organic EL elements have characteristics that the elements emit light, the elements may be made very thin, the elements are light weight, and the elements have a wide viewing angle and a high-speed responsibility. Thus, the organic EL display devices are expected as the next-generation thin display devices. However, as the performance of liquid crystal display devices has become higher and the cost thereof has become lower, the performances and the price required for organic EL display devices have been becoming severer. In particular, from the viewpoint of costs, organic EL display devices are more expensive than liquid crystal display devices, the mass-producing technique of which has been established. Thus, it is urgently necessary to reduce the costs thereof.

One of factors of an increase in costs of organic EL display devices is that the yield thereof is low. Factors of lowering the yield of organic EL display devices are various. In particular, the yield is lowered by defects of pixels in many cases. The pixel defects are caused by the generation of a short circuit based on dust or dirt, the contact of a mask for dividing pixels into different colors with the pixels, a failure in light exposure based on dust or dirt. Owing to such pixel defects, pixels in a screen partially come not to emit light, or partially are in a constantly lit state which is unable to be controlled.

A device is deemed defective even when only a a minority of pixels in a screen are defective as described above. For this reason, methods of preventing the contact of pixels with dust or dirt, or a mask, thereby decreasing defects are known. However, it is difficult to remove defective pixels completely, and a great improvement in yield is not easily attained. Thus, the following are suggested as a method for repairing defective pixels: a method of applying a high-voltage pulse to a short-circuited moiety to make the moiety electrically non-conductive, thereby restoring the pixels therein to normal pixels (see Japanese Patent Application Laid-Open (JP-A-) No. 11-162637); and a method of radiating a laser ray to defective pixels to repair the pixels (see, for example, JP-A Nos. 2007-42498 and 2006-323032). When an electric current is constantly supplied to an EL element due to, for example, a short circuit of a driving transistor so that the EL element is in a constantly lit state, only a current-supplying line for the pixel made of this EL element is cut by a laser, thereby changing the constantly lit pixel to a constantly non-lit pixel and making the defect inconspicuous. However, if an image appears on the screen in which all pixels adjacent thereto are luminous and with a high brightness, the constantly non-lit pixel conversely becomes a conspicuous defect.

Suggested are also a method of setting up, for an expected defect, a preliminary storage capacitance or switching element, and a method of constructing pixels prepared for a case where some of the pixels become defect pixels (see, for example, JP-A Nos. 2005-92154 and 2003-15549). However, according to such a method, it becomes necessary to prepare extra defect-overcoming measures also for normal pixels, which are most of the entire pixels. As a result, the number of the producing steps increases to raise costs, the definition of the pixels deteriorates, the pixel numerical aperture lowers, and other inconveniences are caused. Thus, the method is not an easy method. Additionally, no countermeasures are taken for pixel defects based on an unexpected inferiority; thus, the defects may not be repaired.

SUMMARY OF THE INVENTION

The invention has been made in view of the above circumstances, and provides the following display device and method for repairing a defective pixel.

According to a first aspect of the invention, provided is a display device, including: a supporting substrate; pixels arranged over the supporting substrate; and a member which is arranged on the light extraction side of a defective pixel, the defective pixel being in a constantly non-lit state, the member being imparted with a light scattering property by the selective application of external energy.

According to a second aspect of the invention, provided is a method for repairing a defective pixel, including: performing an examination for specifying a defective pixel which is in a constantly non-lit state from among pixels arranged over a supporting substrate in a display device; and applying external energy selectively to at least one member arranged on the light extraction side of the defective pixel specified by the examination, thereby imparting a light scattering property to the member.

DETAILED DESCRIPTION OF THE INVENTION

With reference to the attached drawings, the display device and the method for repairing a defective pixel according to the present invention will be described hereinafter.

The inventors, in their quest for an ideal repairing method, have discovered that when external energy is selectively applied to at least one member arranged at the light-extraction side of a defective pixel in a constantly non-lit state, so as to impart a light scattering property to the member, the following may be attained: when a pixel adjacent to the defective pixel does not emit light, the defective pixel is viewed as it is, that is, as a defective pixel which does not emit light; and when the adjacent pixel emits light, the defective pixel is caused to be viewed as if itself is also emits light.

The invention has subsequently been achieved by repeated research and investigation on the part of the inventors.

Figure 1:
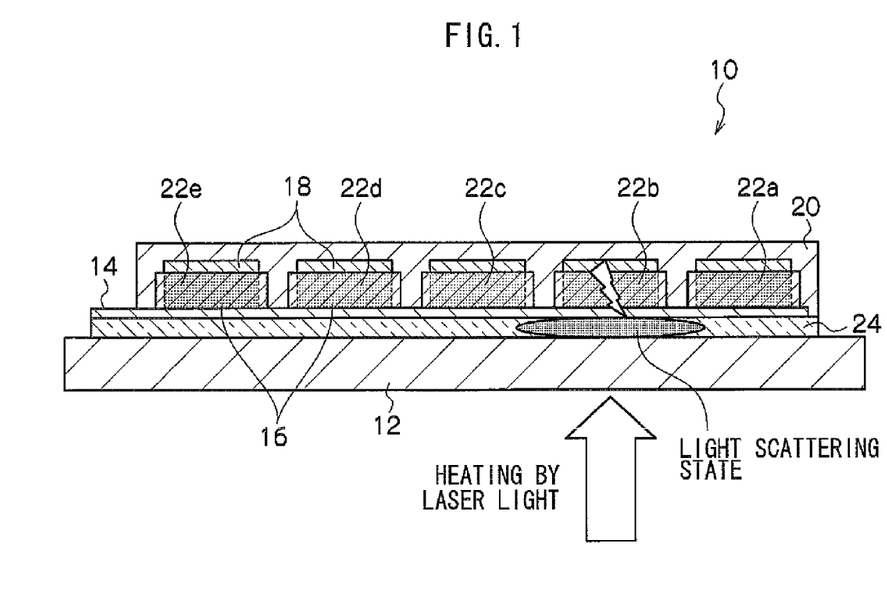
FIG. 1 is a schematic view illustrating an example wherein a thermosensitive layer in a defective pixel region is selectively changed to a light scattering state.

FIG. 1 is a schematic view illustrating an example of the display device according to the invention. This display device 10 has a supporting substrate 12, a pair of electrodes 14 and 18 arranged over the supporting substrate 12 in the thickness direction, and an organic EL layer 16 containing a light emitting layer and sandwiched between the pair of the electrodes 14 and 18. The light emitting layer in regions sandwiched between the electrodes 14 and 18 emits light. Pixels 22a to 22e made of organic EL elements having the above-mentioned structure are arranged lengthwise and crosswise on the supporting substrate 12. Light from the light emitting layer (the pixels) is extracted from the supporting substrate 12 side of the device (a bottom emission type). A thermosensitive layer 24, which is heated to a specified temperature or higher so as to be changed from a transparent state to a light scattering state, is formed between the supporting substrate 12 on the light extraction side and the lower electrode 14. An external energy is selectively applied to the thermosensitive layer 24 arranged on the light extraction side of the defective pixel 22b that has been in a constantly non-lit state of the pixels 22a to 22e arranged on the supporting substrate 12. In this way, a light scattering property is imparted to the thermosensitive layer 24 on the light extraction side of the pixel 22b.

Figure 2:
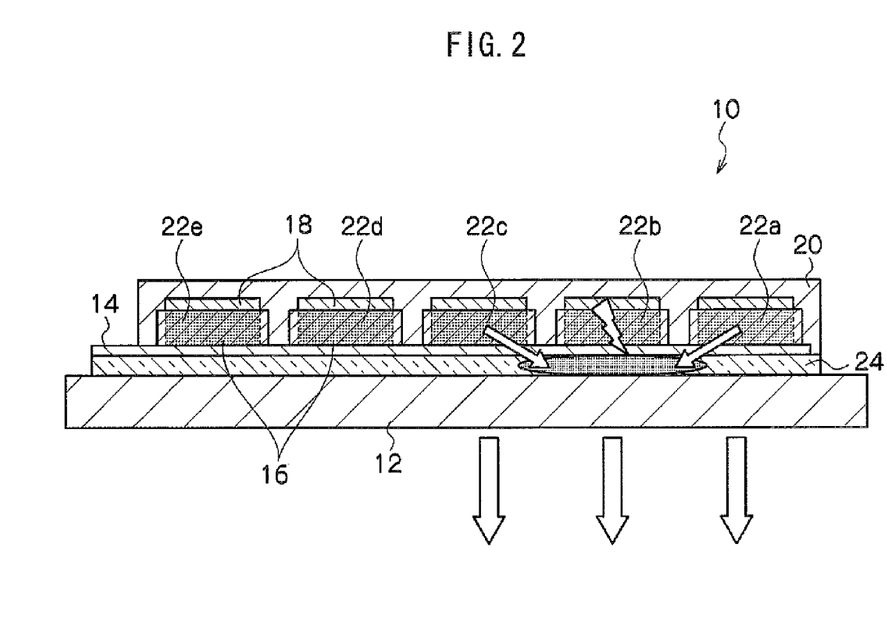
FIG. 2 is a schematic view illustrating a state that the defective pixel appears to be luminous through the region of the thermosensitive layer selectively changed to a light scattering state.

As described above, in the constantly non-lit defective pixel 22b, an external energy is selectively applied to the member arranged on the light extraction side of the moiety of the defect regardless of the kind of the defect and a cause thereof, so as to impart a light scattering property to the member, whereby the constantly non-lit defective pixel 22b may be made substantially inconspicuous. In particular, when the thermosensitive layer 24 is arranged closely near the light extraction side of the elements, the photosensitive layer 24, which is changed to a light scattering state at a position corresponding to the defective pixel, easily picks up light from the adjacent pixels 22a and 22c, which are normal pixels, as illustrated in FIG. 2. As a result, the existence of the defective pixel may be made extremely inconspicuous.

In the invention, the member arranged on the light extraction side of the defective pixel 22b and imparted with a light scattering property by the selective application of external energy is not limited to the thermosensitive layer 24, and may be, for example, the supporting substrate 12 or a sealing member.

The following will describe a method for repairing one or more defective pixels when an organic EL display device as described above is produced, and will more specifically describe the display device according to the invention.

Figure 3:
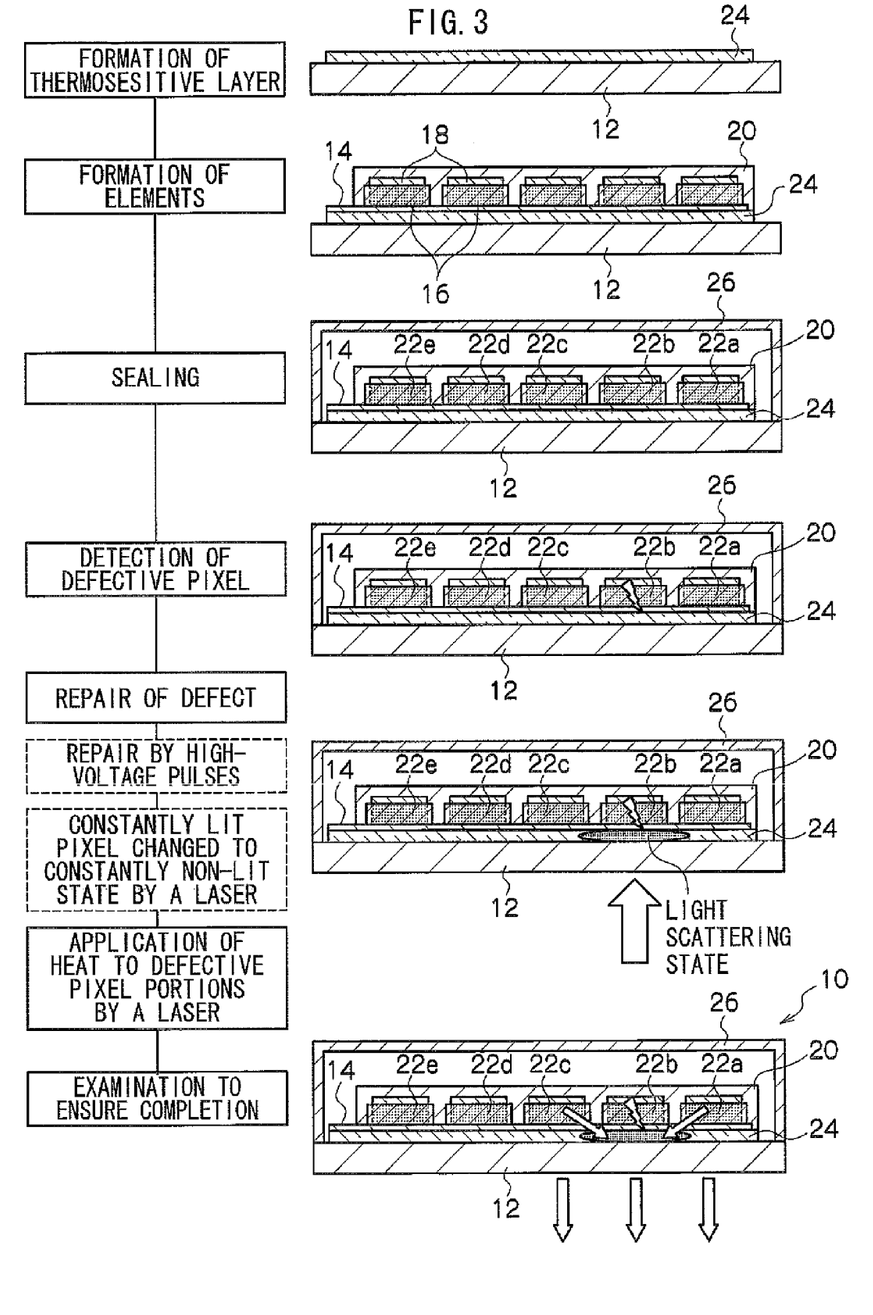
FIG. 3 is a chart showing an example of a producing process of a display device according to the invention.

FIG. 3 are a flowchart showing an example of the method for repairing one or more defective pixels according to the invention.

<Supporting Substrate>

The supporting substrate 12 is not particularly limited as long as the substrate is a member having a strength capable of supporting members constituting the organic EL elements, light transmissibility and the like. The supporting substrate 12 may be a known supporting substrate. Examples of the material thereof include inorganic materials such as zirconia stabilized yttrium (YSZ), and glass; and organic materials such as, polyester such as polyethylene terephthalate, polybutylene phthalate, polyethylene naphthalate and the like, polystyrene, polycarbonate, polyethersulfone, polyarylate, polyimide, polycycloolefin, norbornene resin, and poly(chlorotrifluoroethylene).

When a substrate made of glass is used as the supporting substrate 12, the glass is preferably non-alkali glass in order to decrease ions eluted from the glass. When soda lime glass is used, it is preferred to provide a barrier coat such as silica on the glass.

In the case of using the supporting substrate 12 made of an organic material, it is preferred that the substrate 12 is excellent in heat resistance, dimension stability, solvent resistance, electric non-conductance and workability. In the case of using, in particular, a plastic supporting substrate, it is preferred to form a moisture permeation preventing layer or a gas barrier layer onto one side or both sides of the supporting substrate 12 in order to restrain the permeation of moisture or oxygen. The material of the moisture permeation preventing layer or the gas barrier layer is preferably an inorganic material such as silicon nitride or silicon oxide. The moisture permeation preventing layer or the gas barrier layer may be formed by, for example, high-frequency sputtering.

In the case of using a thermoplastic supporting substrate, a hard coat layer, an undercoat layer or the like may be formed thereon as the need arises.

The shape, the structure, the size and other characters of the supporting substrate 12 are not particularly limited, and these may be appropriately selected in accordance with the use manner and the use purpose of the organic EL display device 10. In general, the shape of the supporting substrate 12 is preferably a plate-like shape from the viewpoint of the handleability, the easiness of the formation of the organic EL elements. The structure of the supporting substrate 12 may be a monolayer structure or a laminated structure. The supporting substrate 12 may be made of a single member, or two or more members.

In general, organic EL display devices are classified into: a bottom emission type, in which light emitted from a light emitting layer is extracted from the supporting substrate side of a display device; and a top emission type, in which the same light is extracted from the side opposite to the supporting substrate side. In the invention, any one of the two types may be adopted. When a top emission type organic EL display device is produced, it is unnecessary to extract light from the supporting substrate 12 side; thus, the supporting substrate may be a metallic substrate made of, for example, stainless steel, Fe, Al, Ni, Co, Cu or any alloy thereof. The metallic supporting substrate has a high strength, flexibility, and a high gas barrier property against moisture or oxygen in the atmosphere even if the thickness thereof is small. When the metallic supporting substrate is used, it is necessary to provide an insulating film for ensuring electric non-conductance between the supporting substrate 12 and the lower electrode 14.

<Thermosensitive Layer>

The thermosensitive layer 24 is formed on the supporting substrate 12 (FIG. 3(A)).

In the invention, an external energy is selectively applied to at least one member arranged on the light extraction side of a defective pixel that is a constantly non-lit, thereby imparting a light scattering property to the member. The member to which the light scattering property is to be imparted is not particularly limited as long as the member is which is usually in a transparent state but turns selectively into a light scattering state by undergoing heating or radiation of a laser ray under a specified condition. The member is preferably the thermosensitive layer 24, which changes from a transparent state to a light scattering state when the layer is heated to a specified temperature or higher. The thermosensitive layer 24 may be made of a thermosensitive material containing a low molecular weight organic material and a resin matrix and having a light transmittance which varies depending on temperature, as disclosed in, for example, JP-A No. 54-119377 or 5-8538.

The low molecular weight organic material, which constitutes the thermosensitive layer 24, may be a low molecular weight organic material that changes from a transparent state to a light scattering state when the thermosensitive layer is heated to a specified temperature or higher. Specific examples thereof include higher fatty acids such as lauric acid, dodecanoic acid, myristic acid, pentadecanoic acid, palmitic acid, stearic acid, behenic acid, nonadecanoic acid, arachidonic acid, and oleic acid; higher fatty acids having a high melting point (about 80 to 150° C.) such as lignoceric acid, cerotic acid, montanoic acid, melissic acid, eicosanoic diacid, pentatriacontanoic acid, hexatriacontanoic acid, heptatriacontanoic acid, octatriacontanoic acid, and hexatetracontanoic acid; higher fatty acid esters such as methyl stearate, tetradecyl stearate, octadecyl stearate, octadecyl laurate, tetradecyl palmitate, and dodecyl behenoate; and ethers or thioethers described below.

In the display device according to the invention, the electrodes 14 and 18 generate heat when the device is used. Thus, the thermosensitive layer 24 is heated. When the crystallinity of the thermosensitive layer 24 is changed by the heat from the electrodes 14 and 18, it is feared that even the pixel moieties which are originally normal are changed to a light scattering state. For this reason, the material used as the low molecular weight organic material which constitutes the thermosensitive layer 24 is a material the light transmissibility of which is not changed by the heat from the electrodes 14 and 18 so that a transparent state is kept. The material is selected from low molecular weight organic materials which change from a transparent state to a light scattering state at a temperature preferably from 60° C. or more and 250° C. or less, more preferably from 70° C. or more and 200° C. or less, even more preferably from 90° C. or more and 150° C. or less.

The resin matrix which constitutes the thermosensitive layer 24 is preferably a resin good in transparency, mechanical strength and film-formability in order that a low molecular weight organic material as described above may be dispersed therein. Examples of the resin include polyvinyl chloride; vinyl chloride containing copolymers such as vinyl chloride/vinyl acetate copolymer, vinyl chloride/vinyl acetate/vinyl alcohol copolymer, vinyl chloride/vinyl acetate/maleic acid copolymer, and vinyl chloride/acrylate copolymer; polyvinylidene chloride; vinylidene chloride containing copolymers such as vinylidene chloride/vinyl chloride copolymer, and vinylidene chloride/acrylonitrile copolymer; polyesters; polyamides; polyacrylates, polymethacrylates, and acrylate/methacrylate copolymers; and silicone resins. These may be used alone or in the form of a mixture of two or more thereof.

The ratio by mass between the resin matrix and the low molecular weight organic material, which is varied in accordance with the used materials, is usually from 1:2 to 16:1, preferably from 1:1 to 10:1, more preferably from 2:1 to 6:1 in order to attain a sure change into the light scattering state by heating.

The method for forming the thermosensitive layer 24 of the low molecular weight organic material and the resin matrix is preferably, for example, a method of applying, onto the supporting substrate 12, a solution wherein the resin matrix and the low molecular weight organic material are dissolved or a dispersion wherein the low molecular weight organic material is dispersed in the form of fine particles in a solution of the resin matrix, and then drying the resultant.

The solvent used in the solution or the liquid dispersion may be selected in accordance with the used resin matrix and low molecular weight organic material. Examples thereof include tetrahydrofuran, methyl ethyl ketone, methyl isobutyl ketone, chloroform, carbon tetrachloride, ethanol, toluene, and benzene. These solvents may be used alone or in the form of a mixed solvent.

It is sufficient to provide the thermosensitive layer 24 at at least positions corresponding to pixels to be formed; it is preferable to provide the thermosensitive layer 24 evenly at the entire surface of the region where the pixels are to be arranged. It is easier to arrange the layer 24 evenly in the whole surface of the region where the pixels are to be arranged than, for example, to arrange the layer 24 selectively in positions corresponding to the individual pixels. In particular, by applying the solution or the dispersion for forming the thermosensitive layer 24 evenly on the entire surface of the region where the pixels are to be formed and then drying the resultant, the thermosensitive layer 24 may be easily formed in an even state. Examples of the application method include spin coating, air knife coating, curtain coating, roller coating, wire bar coating, gravure coating, and slide coating.

It is advisable to adjust the thickness of the thermosensitive layer 24 to an appropriate thickness. If the layer is too thin, the layer 24 may not sufficiently pick up light from the adjacent pixels 22a and 22c. If the layer is too thick, the light transmissibility may lower. From such viewpoints, the thickness of the thermosensitive layer 24 is usually from 0.5 to 200 µm, preferably from 1 to 100 µm, more preferably from 2 to 50 µm.

<Organic EL Element>

The organic EL elements are formed on the thermosensitive layer 24 (FIG. 3(B)).

The organic EL elements have a structure wherein the pair of the electrodes (the lower electrode 14 and the upper electrode 18) is arranged over the supporting substrate 12 in the thickness direction thereof, and the organic EL layer 16, which contains the light emitting layer, is sandwiched between the pair of the electrodes 14 and 18. For the organic EL elements, layer structures as described below may be adopted. However, the layer structure of the elements is not limited thereto, and may be appropriately decided in accordance with the use purpose of the display device.

Anode/light emitting layer/cathode

Figure 4:
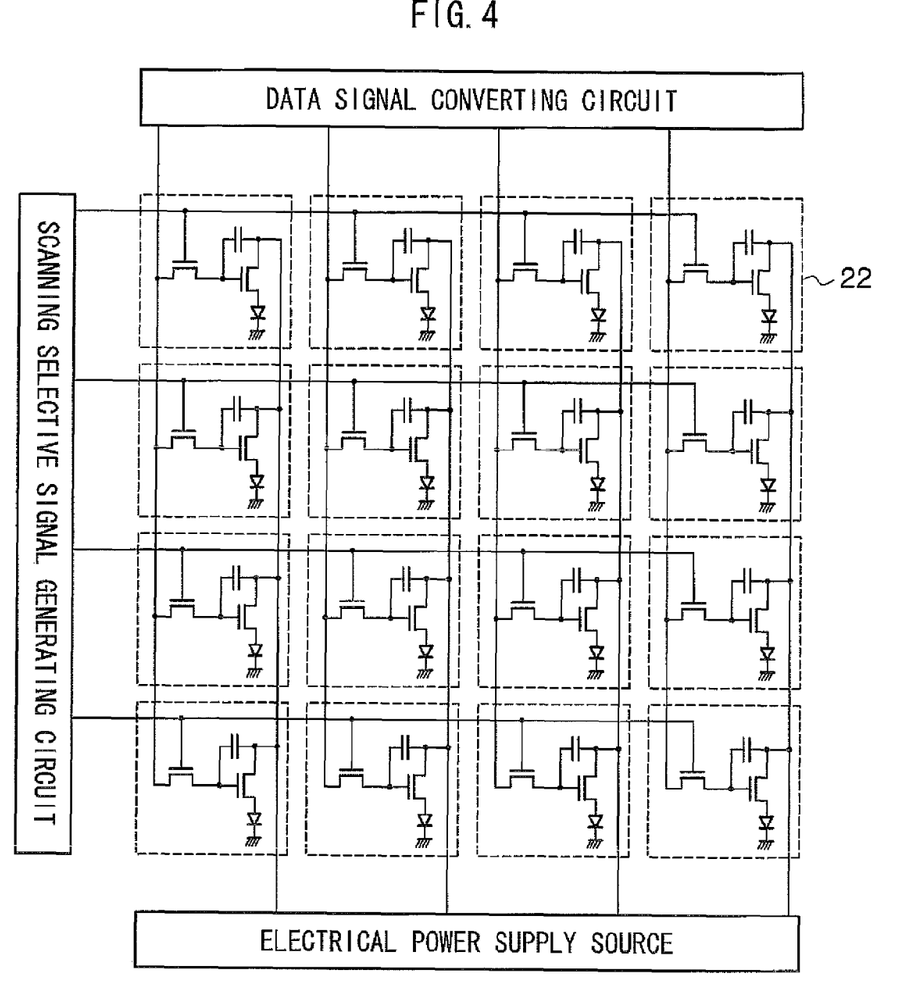
FIG. 4 is a view illustrating an example of the circuit structure of an active matrix driving device.

Anode/hole transporting layer/light emitting layer/electron transporting layer/cathode Anode/hole transporting layer/light emitting layer/blocking layer/electron transporting layer/cathode Anode/hole transporting layer/light emitting layer/blocking layer/electron transporting layer/electron injecting layer/cathode Anode/hole injecting electrode/hole transporting layer/light emitting layer/blocking layer/electron transporting layer/cathode Anode/hole injecting layer/hole transporting layer/light emitting layer/blocking layer/electron transporting layer/electron injecting layer/cathode In general, driving methods of organic EL display devices are classified into active matrix driving and passive matrix driving. In the invention, any driving method may be adopted. The invention is particularly effective for active matrix driving display devices. FIG. 4 illustrates an example of the circuit structure of an active matrix driving method. In general, in an active matrix driving circuit structure, for each pixel 22, an element-driving circuit is formed which has a thin film transistor (TFT) containing a switching element and a driving element, and a capacitor for storing data. Electric current is supplied to the pixels selected through scanning lines and data lines so that the pixels emit light. This manner of active matrix driving display device has the advantages of low power consumption and high image quality. However, production costs are high; and when defective pixels in a constantly non-lit state are generated by problems with a TFT, it is very difficult to repair the pixels in a known manner, such as by radiation with a laser. In the invention, however, an external energy is selectively applied, to at least one member arranged at the light extraction side of a defective pixel that is in a constantly non-lit state, preferably to the thermosensitive layer 24, thereby imparting a light scattering property to the member. In this way, the existence of defective pixels may be made inconspicuous; therefore, even if defective pixels caused by problems with a TFT are present, the pixels may easily be repaired at low cost.

In the meantime, a passive matrix driving display device is lower in producing costs than the active matrix driving devices. Moreover, when a short circuit is generated, a defective pixel is not generated but a constantly non-lit line is generated. However, when an area from which no light is emitted (dark spot) is generated by, for example, an exfoliation between the electrodes and the organic EL layer, the thermosensitive layer 24 according to the invention is selectively made into a light scattering state in the area, whereby the defect may easily be repaired.

<Electrodes>

The pair of electrodes 14 and 18 on the supporting substrate 12 are arranged to sandwich the organic EL layer 16 therebetween. One of the electrodes is an anode and the other is a cathode. It is necessary that the light transmissibility of the electrode on one side of the device from which light emitted from the light emitting layer is extracted is high. Usually, a transparent anode is formed; however, it is also possible to form a transparent cathode and extract light from the cathode side of the device.

—Anode—

The anode is not particularly limited about the shape, the structure, the size and other characters as long as the anode is a member having a function of an electrode for supplying holes to the organic EL layer 16. The anode may be appropriately selected from known electrode materials in accordance with the use manner and the use purpose of the organic EL display device 10.

Preferred examples of the material which constitutes the anode include metals, alloys, metal oxides, electroconductive compounds, and mixtures thereof. Specific examples thereof include electroconductive metal oxides such as tin oxide doped with antimony or fluorine (ATO, or FTO), tin oxide, zinc oxide, indium oxide, indium tin oxide (ITO), and indium zinc oxide (IZO); metals such as gold, silver, chromium, and nickel; mixtures or laminates each composed of two or more selected from the metals and the electroconductive metal oxides; electroconductive inorganic materials such as copper iodide and copper sulfide; electroconductive organic materials such as polyaniline, polythiophene, and polypyrrole; and laminates each composed of one or more selected from these materials, and ITO. Among these materials, electroconductive metal oxides are preferred. ITO is particularly preferred from the viewpoint of productivity, high electric conductivity, and transparency.

Examples of the method for forming the anode include wet methods such as printing and coating methods; physical methods such as vacuum deposition, sputtering, and ion plating; and chemical methods such as CVD and plasma CVD. The method may be appropriately selected, considering suitability for the material which constitutes the anode. When ITO is used as the anode material, for example, the anode may be formed by DC or high frequency sputtering, vacuum deposition) ion plating or the like.

The position where the anode is formed may be appropriately selected in accordance with the use manner and the use purpose of the organic EL display device 10. The anode may be formed on the whole of the supporting substrate 12, or on a partial region thereof.

When the anode is formed, patterning may be performed by chemical etching based on photolithography or the like, or by physical etching using a laser or the like. The patterning may be performed by vacuum vapor deposition, sputtering or the like in the state that a mask is put on the anode material. The patterning may be performed by a liftoff method or a printing method.

The thickness of the anode may be appropriately selected in accordance with the material which constitutes the anode, and is usually from about 10 nm to 50 µm, preferably from 50 nm to 20 µm.

The resistivity of the anode is preferably from $10^3 \Omega/\square$ or less, more preferably $10^2 \Omega/\square$ or less in order to supply holes certainly to the organic EL layer 16.

When light is extracted from the anode side, the light transmissibility of the anode is preferably 60% or more, more preferably 70% or more. Transparent anodes are described in detail in "New Development of Transparent Electrode Films", supervised by Yutaka Sawada, published by CMC Publishing Co., Ltd. (1999). Matters described therein may be applied to the invention. In the case of using, for example, a low heat-resistant supporting substrate made of a plastic, ITO or IZO is used. A transparent anodes made into a film form at a low temperature of 150° C. or lower is preferred.

—Cathode—

The cathode usually has an electrode function of supplying electrons to the organic EL layer 16, and is not particularly limited about the shape, the structure, the size. The cathode may be appropriately selected from known electrodes in accordance with the use manner and the use purpose of the organic EL display device 10. Examples of the material which constitutes the cathode include metals, alloys, metal oxides, electroconductive compounds, and mixtures thereof. Specific examples include alkali metals (such as Li, Na, K and Cs), alkaline earth metals (such as Mg, and Ca), gold, silver, lead, aluminum, sodium-potassium alloy, lithium-aluminum alloy, magnesium-silver alloy, and rare earth metals such as indium, and ytterbium. These may be used alone. In order to make the stability and the electron-injecting performance of the cathode compatible with each other, they are preferably used in combination of two or more thereof.

Of these materials, alkali metals or alkaline earth metals are preferred as the material which constitutes the cathode from the viewpoint of electron injecting performance. From the viewpoint of excellent storage stability, a material made mainly of aluminum is preferred. The material made mainly of aluminum is aluminum alone, an alloy composed of aluminum and 0.01 to 10% by mass of an alkali metal or alkaline earth metal, or a mixture composed of aluminum and such a metal (for example, lithium-aluminum alloy or magnesium-aluminum alloy). The material of the cathode is described in detail in, for example, P-A Nos. 2-15595 and 5-121172. The materials described in these publications may be used in the invention.

The method for forming the cathode is not particularly limited. Thus, the cathode may be formed by a known method. The cathode may be formed by a method selected appropriately from wet methods such as printing and coating methods, physical methods such as vacuum vapor deposition and sputtering, ion plating, chemical methods such as CVD and plasma CVD, considering suitability for the material which constitutes the cathode. In the case of selecting, for example, a metal as the material of the cathode, the cathode may be formed, for example, by sputtering a single species, or sputtering two or more species simultaneously or successively.

The thickness of the cathode may be appropriately selected in accordance with the material which constitutes the cathode or the light extraction direction. The thickness is usually from about 1 nm to 5 µm.

When the cathode is formed, patterning may be performed by chemical etching based on photolithography or the like, or by physical etching using a laser or the like. The patterning may be performed by vacuum vapor deposition, sputtering or the like in the state that a mask is put on the cathode material. The patterning may be performed by a liftoff method or a printing method.

The position where the cathode is formed is not particularly limited. The cathode may be formed on the whole of the organic EL layer 16, or on a partial region thereof.

<Organic EL Layer>

The organic EL layer 16 sandwiched between the upper and lower electrodes (anode and cathode) 14 and 18 is an organic compound layer containing at least a light emitting layer (light emitting region). As described above, examples of the layer which constitutes the organic EL layer 16 and is different from the light emitting layer include a hole transporting layer, an electron transporting layer, a charge blocking layer, a hole injecting layer, and an electron injecting layer. A preferred embodiment of the layer structure of the organic EL layer is an embodiment wherein from the anode side of the display device a hole transporting layer, a light emitting layer and an electron transporting layer are successively laminated. The display device may have a charge blocking layer or the like, for example, between the hole transporting layer and the light emitting layer or between the light emitting layer and the electron transporting layer. The device may have a hole injecting layer between the anode and the hole transporting layer, or an electron injecting layer between the cathode and the electron transporting layer. Each of the layers may be divided to a plurality of secondary layers.

Each of the layers which constitute the organic EL layer 16 may be preferably formed by any method selected from dry film-forming methods such as vapor deposition or sputtering, a transferring method, a printing method.

—Light Emitting Layer—

The light emitting layer is a layer having a function of receiving holes from the anode, the hole injecting layer or the hole transporting layer and receiving electrons from the cathode, the electron injecting layer or the electron transporting layer when an electric field is applied to the display device, so as to supply a field where the holes are recombined with the electrons.

The light emitting layer may be made only of a light emitting material, or may be made of a mixture of a host material and a light emitting material. Furthermore, the light emitting layer may contain therein a material which has no electron transportability and emits no light. The light emitting layer may be made of a single layer, or two or more secondary layers. The secondary layers may emit light rays in different colors, respectively.

The light emitting material may be a fluorescence emitting material or a phosphorescence emitting material, and may be doped with one or more dopants.

Examples of the fluorescence emitting material include benzoxazol derivatives, benzimidazole derivatives, benzothiazole derivatives, styrylbenzene derivatives, polyphenyl derivatives, diphenylbutadiene derivatives, tetraphenylbutadiene derivatives, naphthalimide derivatives, coumarin derivatives, condensed aromatic compounds, perynone derivatives, oxadiazole derivatives, oxazine derivatives, aldazine derivatives, pyridine derivatives, cyclopentadiene derivatives, bisstyrylanthracene derivatives, quinacridon derivatives, pyrrolopyridine derivatives, thiadiazolopyridine derivatives, cyclopentadiene derivatives, styrylamine derivatives, diketopyrrolopyrrole derivatives, aromatic dimethylidyne compounds, various metal complexes, typical examples of which include metal complexes of an 8-quinolinol derivative, and metal complexes of a pyrromethene derivative, polymeric compounds such as polythiophene, polyphenylene and polyphenylenevinylene, and organic silane derivatives.

Examples of the phosphorescence emitting material include complexes each containing a transition metal atom or a lanthanoid atom.

The transition metal atom is not particularly limited, and is preferably ruthenium, rhodium, palladium, tungsten, rhenium, osmium, iridium, or platinum, more preferably rhenium, iridium or platinum.

Examples of the lanthanoid atom include lanthanum, cerium, praseodymium, neodymium, samarium, europium, gadolinium, terbium, dysprosium, holmium, erbium, thulium, ytterbium, and lutetium. Of these lanthanoid atoms, neodymium, europium and gadolinium are preferred.

Examples of the ligand of the complexes include ligands described in G. Wilkinson et al., "Comprehensive Coordination Chemistry", published by Pergamon Press Co. in 1987; H. Yersin, "Photochemistry and Photophysics of Coordination Compounds", published by Springer-Verlag Co. in 1987; and Akio Yamamoto, "Organometallic Chemistry—Foundation and Application—", published by Shokabo Publishing Co., Ltd. in 1982.

Preferred specific example of the ligand include halogen ligands (preferably, a chlorine ligand), nitrogen-containing heterocyclic ligands (such as phenylpyridine, benzoquinoline, quinolinol, bipyridyl, and phenantrloline), diketone ligands (such as acetylacetone), carboxylic acid ligands (such as an acetic acid ligand), a carbon monoxide ligand, an isonitrile ligand, and a cyano ligand. More preferred are nitrogen-containing heterocyclic ligands. The above-mentioned complexes may each have a single transition metal atom in the compound thereof, or may each be a multi-nucleus complex, which has two or more transition metal atoms. The multi-nucleus complex may have different metal atoms simultaneously.

The phosphorescence emitting material is contained in the light emitting layer preferably in a proportion of 0.1 to 40% by mass of the layer, more preferably in a proportion of 0.5 to 20% by mass thereof.

The host material contained in the light emitting layer is preferably an electron transporting material. About the host material, a single species thereof may be used, or two or more species thereof may be used. The host material is composed of, for example, a host material having electron transportability and a host material having hole transportability.

Specific examples of the host material include materials having a carbazole skeleton, materials having a diarylamine skeleton, materials having a pyridine skeleton, materials having a pyrazine skeleton, materials having a triazine skeleton, materials having an arylsilane skeleton, and materials exemplified in items "hole injecting layer, and hole transporting layer", and "electron injecting layer, and electron transporting layer", which will be described later.

The thickness of the light emitting layer is not particularly limited. Usually, the thickness is preferably from 1 to 500 nm, more preferably from 5 to 200 nm, even more preferably from 10 to 100 nm.

—Hole Injecting Layer, and Hole Transporting Layer—

The hole injecting layer and the hole transporting layer are each a layer having a function of receiving holes from the anode or the anode side of the display device and transporting the holes to the cathode side thereof. Specifically, the hole injecting layer and the hole transporting layer are each preferably a layer containing one or more selected from carbazole derivatives, pyrrole derivatives, indole derivatives, imidazole derivatives, polyarylalkane derivatives, pyrazoline derivatives, pyrazolone derivatives, phenylenediamine derivatives, arylamine derivatives, amino-substituted chalcone derivatives, styrylanthracene derivatives, fluorenone derivatives, hydrazone derivatives, stylbene derivatives, silazane derivatives, aromatic tertiary amine compounds, styrylamine compounds, aromatic dimethylidene compounds, porphyrin compounds, organic silane derivatives, carbon, and various metal complexes, typical examples of which include Ir complexes each having phenylazole or phenylazine as a ligand.

The thickness of each of the hole injecting layer and the hole transporting layer is preferably 500 nm or less in order to make the driving voltage low.

The thickness of the hole transporting layer is preferably from 1 to 500 nm, more preferably from 5 to 200 nm, even more preferably from 10 to 200 nm. The thickness of the hole injecting layer is preferably from 0.1 to 200 nm, more preferably from 0.5 to 200 nm, even more preferably from 1 to 200 nm.

The hole injecting layer and the hole transporting layer may each have a monolayered structure made of one or more selected from the above-mentioned materials, or a multilayered structure composed of plural secondary layers which have the same composition or different compositions.

—Electron Injecting Layer, and Electron Transporting Layer—

The electron injecting layer and the electron transporting layer are each a layer having a function of receiving electrons from the cathode or the cathode side of the display device and transporting the electrons to the anode side. Specifically, the electron injecting layer and the electron transporting layer are each preferably a layer containing one or more selected from triazole derivatives, oxazole derivatives, oxadiazole derivatives, imidazole derivatives, pyridine derivatives, pyrazine derivatives, pyrimidine derivatives, triazine derivatives, quinoline derivatives, quinoxaline derivatives, phthalazine derivatives, phenanthroline derivatives, silole derivatives, fluorenone derivatives, anthraquinodimethane derivatives, anthrone derivatives, diphenylquinone derivatives, thiopyrandioxide derivatives, carbodiimide derivatives, fluorenylidenemethane derivatives, distyrylpyrazine derivatives, aromatic ring tetracarboxylic acid anhydrides such as naphthalene and perylene, phthalocyanine derivatives, various metal complexes, typical examples of which include metal complexes of an 8-quinolinol derivative, metal phthalocyanines, and metal complexes each having benzoxazole or benzothiazole as a ligand, organic silane derivatives.

The thickness of each of the electron injecting layer and the electron transporting layer is preferably 500 nm or less in order to make the driving voltage low.

The thickness of the electron transporting layer is preferably from 1 to 500 nm, more preferably from 5 to 200 nm, even more preferably from 10 to 100 nm. The thickness of the electron injecting layer is preferably from 0.1 to 200 nm, more preferably from 0.2 to 100 nm, even more preferably from 0.5 to 50 nm.

The electron injecting layer and the electron transporting layer may each have a monolayered structure made of one or more selected from the above-mentioned materials, or a multilayered structure composed of plural secondary layers which have the same composition or different compositions.

—Hole Blocking Layer—

The hole blocking layer is a layer having a function of preventing holes transported from the anode side to the light emitting layer from going through to the cathode side. The hole blocking layer adjacent to the light emitting layer at the cathode side of the display device may be formed.

The hole blocking layer may be made of an organic compound, and examples thereof include aluminum complexes such as BAlq, triazole derivatives, and phenanthroline derivatives such as BCP.

The thickness of the hole blocking layer is preferably from 1 to 500 nm, more preferably from 5 to 200 nm, even more preferably from 10 to 100 nm.

The hole blocking layer may have a monolayered structure made of one or more selected from the above-mentioned materials, or a multilayered structure composed of plural secondary layers which have the same composition or different compositions.

A dielectric layer made of a fluoride of an alkali metal or alkaline earth metal, an oxide, or the like may be formed into a thickness of 0.1 to 5 nm between the cathode and the organic EL layer 16. This dielectric layer may be interpreted as a kind of electron injection layer. The dielectric layer may be formed by, for example, vacuum vapor deposition, sputtering, or ion plating.

The lower electrode 14, the organic EL layer 16 and the upper electrode 18 are successively formed over the supporting substrate 12, thereby forming organic EL elements wherein the organic EL layer 16 containing the light emitting layer is sandwiched between the pair of the electrodes 14 and 18. In this way, the pixels 22, wherein display is attached by light emitted from the light emitting layer sandwiched between the electrodes 14 and 18, are arranged lengthwise and crosswise on the supporting substrate 12.

<Protective Layer>

After the organic EL elements are formed, a protective layer 20 is preferably formed on the upper electrode 18. The protective layer 20 is preferably made of a material capable of restraining components which promote a deterioration of the elements, such as water and oxygen, from invading the inside of the elements. Specific examples thereof include metals such as In, Sn, Pb, Au, Cu, Ag, Al, Ti, and Ni; metal oxides such as MgO, SiO, $SiO_2$, $Al_2O_3$, GeO, NiO, CaO, BaO, $Fe_2O_3$, $Y_2O_3$, and $TiO_2$; metal nitrides such as $SiN_x$, and $SiN_xO_y$; metal fluorides such as $MgF_2$, LiF, $AlF_3$, and $CaF_2$; polymers such as polyethylene, polypropylene, polymethyl methacrylate, polyimide, polyurea, polytetrafluoroethylene, polychlorotrifluoroethylene, polydichlorodifluoroethylene, copolymer made from chlorotrifluoroethylene and dichlorodifluoroethylene, copolymer obtained by copolymerizing tetrafluoroethylene and a monomer mixture containing at least one comonomer, and fluorine-containing copolymers each having, in the copolymer main chain thereof, a cyclic structure; water-absorbing materials having a water absorption of 1% or more; and moisture-proof materials having a water absorption of 0.1% or less.

The method for forming the protective layer 20 is not particularly limited, and may be, for example, a vacuum vapor deposition, sputtering, reactive sputtering, MBE (molecular beam epitaxy), cluster ion beam, ion plating, plasma polymerization (high frequency excited ion plating), plasma CVD, laser CVD, thermal CVD, gas source CVD, coating, printing or transferring method.

The thickness of the protective layer 20 is not particularly limited, and is preferably from 10 nm to 10 μm, more preferably from 50 nm to 2 μm in order to restrain certainly components which promote a deterioration of the elements, such as water and oxygen, from invading the inside of the elements, and further avoid damaging a characteristic that the thickness of the organic EL display device may be small.

<Sealing, and Others>

The whole of the organic EL elements is sealed with a sealing member 26 in order to block invasion of water and oxygen from the outside into the display device (FIG. 3(C)). Examples of the material used for the sealing member 26 include glass, stainless steel, metals (such as aluminum), plastics (such as polychlorotrifluoroethylene, polyester, and polycarbonate), and ceramics. When the display device is of a top emission type, the sealing member 26 needs to be transparent and the member 26 is optimally a glass can from the viewpoint of the barrier property thereof against oxygen and water.

A water absorbent, an inert liquid or the like may be put into the space between the sealing member 26 and the elements in order to prevent a deterioration of the organic EL elements effectively. Specific examples of the water absorbent include barium oxide, sodium oxide, potassium oxide, calcium oxide, sodium sulfate, calcium sulfate, magnesium sulfate, phosphorus pentaoxide, calcium chloride, magnesium chloride, copper chloride, cesium fluoride, niobium fluoride, calcium bromide, vanadium bromide, molecular sieves, zeolite, and magnesium oxide. Examples of the inert liquid include paraffins, liquid paraffins, fluorine-containing solvents (such as perfluoroalkanes, perfluoroamines, and perfluoroethers), chlorine-containing solvents, and silicone oils.

Furthermore, the upper and lower electrodes 14 and 18 are connected to an external power source and circuits (such as a data signal converting circuit and a scanning selective signal generating circuit). For the driving of the elements, a method described in any one of the following may be used: publications of JP-A Nos. 2-148689, 6-301355, 5-29080, 7-134558, 8-234685 and 8-241047, U.S. Pat. Nos. 5,828,429 and 6,023,308, Japanese Patent No. 2784615, and other documents.

<Examination Step>

After the sealing, a defective pixel of the pixels 22 arranged on the supporting substrate 12 that is in a constantly non-lit state is detected and specified by an examination (FIG. 3(D)).

This examination and detection of defective pixels may be conducted in accordance with any method that is capable of ascertaining the kind of defective pixel and the position thereof. For example, electric current may be supplied to all of the pixels, thereby making it possible to determine constantly non-lit pixels, constantly lit pixels, and normal pixels.

<Repairing Step>

Energy is selectively applied externally to at least one member arranged at the light extraction side of the defective pixel specified by the examination (FIG. 3(E)), thereby imparting a light scattering property to the member. Specifically, after the constantly non-lit defective pixel is ascertained by the examination, the region of the thermosensitive layer 24 which corresponds to the defective pixel 22b is selectively heated, to change its state from a transparent state to a light scattering state.

Of all the defective pixels it is preferable to restore to a normal pixel one that can be restored to a normal pixel by a known method. For example, a constantly non-lit pixel caused by a short circuit between the upper and lower electrodes may be changed to a normally drivable pixel by removing leakage between the electrodes, using high-voltage pulses or a laser.

On the other hand, it is very difficult to restore a constantly lit pixel resulting from a fault with a TFT or the like to a normal pixel by a known method, such as high-voltage pulses. Thus, it is preferable that a constantly lit pixel, if present, is processed beforehand to a constantly non-lit pixel, for example, by cutting only the electric power supplying line for the constantly lit pixel by a laser, whereby the pixel may be changed to being constantly non-lit. When a constantly lit pixel is processed to a constantly non-lit pixel in such a way before heating the thermosensitive layer 24 selectively to impart a light scattering property to the layer, the thermosensitive layer 24 is subsequently selectively heated at regions thereof corresponding to each of the defective pixels after the processing, whereby the defective pixels may be repaired.

As described above, a constantly non-lit defective pixel that can be repaired by a laser or the like is repaired to a normal pixel as the need arises, while a constantly lit pixel is changed to a constantly non-lit pixel.

When defective pixels are changed to only constantly non-lit pixels which are unable to be repaired, the thermosensitive layer 24 is heated selectively at positions thereof corresponding to the constantly non-lit defective pixels so that the layer at the positions acquires a light scattering state. The method for the heating is not particularly limited, as long as it can heat only the regions corresponding to the defective pixels. Examples thereof include radiation of a laser ray, and heating by means of a thermal head or the like. In particular, when a laser light is radiated to the thermosensitive layer 24 from the light extraction side of the display device, the layer 24 may be locally heated; thus, the use of laser light is very effective when the formed pixels are small.

It is not necessarily essential to impart a light scattering property to the entire region of the thermosensitive layer 24 at the location of the defective pixel 22b. It is sufficient that a part of the entire region of the defective pixel 22b acquires a light scattering state. It is preferable that the thermosensitive layer 24 is imparted with a light scattering state up to a position that overlaps partially with regions of one or more pixels that are adjacent to the defective pixel, in particular, a partial region of one or more adjacent pixels having the same luminous color as the defective pixel. When a thermosensitive layer acquires a light scattering state at a position corresponding to a defective pixel and additionally up to a position that overlaps partially with regions of one or more normal pixels adjacent to the defective pixel, since light emitted from the one or more adjacent pixels is readily incident at a defective pixel region of the thermosensitive layer having a light scattering state, it appears just as if the defective pixel emits light.

Figure 5:
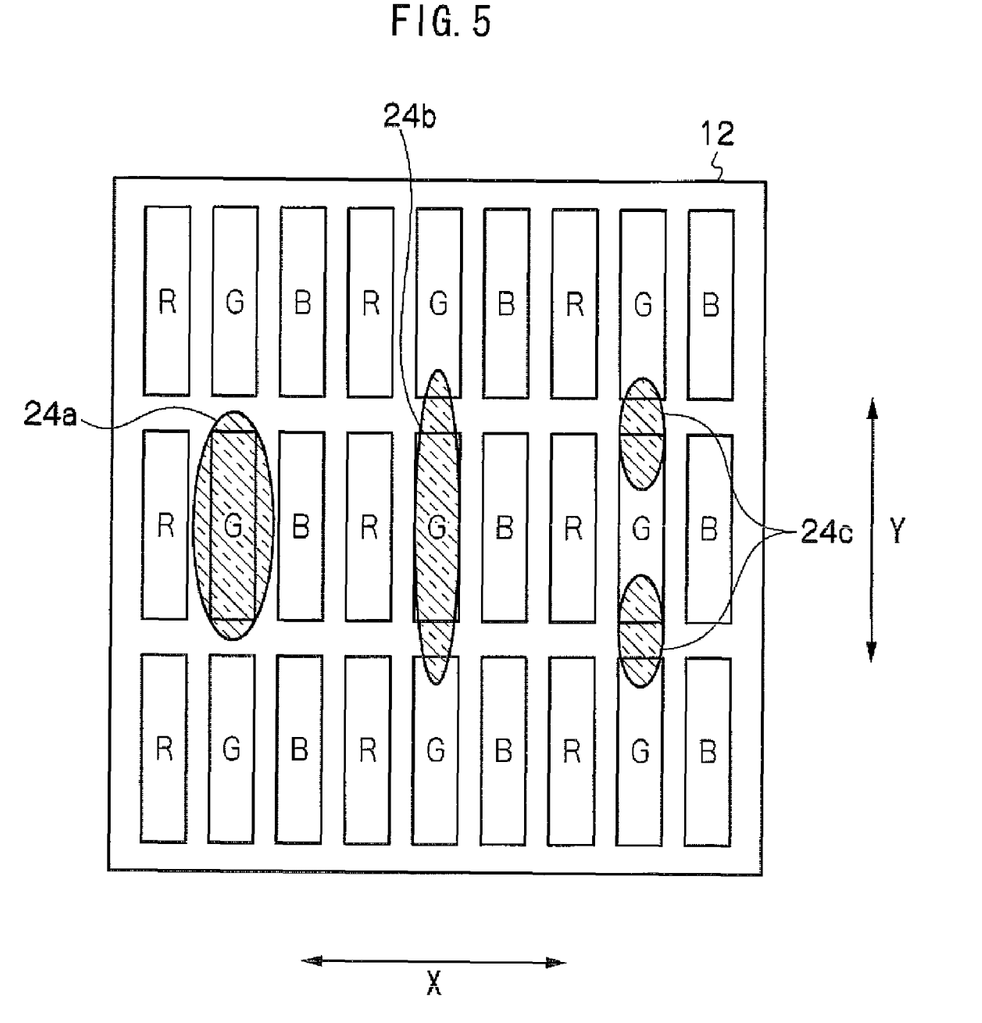
FIG. 5 is a schematic view illustrating an example of regions changed to a light scattering state.

FIG. 5 illustrates an example of a portion of the display device corresponding to defective pixels where the thermosensitive layer is imparted with a light scattering state. In the direction of X on the supporting substrate 12, pixels RGB are repeatedly arranged; in the direction of Y, the pixels are arranged to have the same luminous colors, respectively. In such a pixel arrangement, a light scattering region 24a of the thermosensitive layer may be arranged to cover only a defective pixel (G). When the distance between the pixels of the same color is small, the portions of the thermosensitive layer corresponding to the defective pixels which is given a light scattering state easily picks up light from adjacent pixels of the same luminous color (G). As a result, the defective pixel is more readily viewed as if the pixel emits the original color (G).

A portion of the thermosensitive layer region 24b which has acquired a light scattering state may cover the whole of a defective pixel (G) and may further overlap a partial region of each of pixels (G) which are adjacent to the defective pixel G on both sides thereof and which are of the same color as G. Alternatively, each of two portions of the thermosensitive layer 24c imparted with a light scattering state may overlap a partial region of a defective pixel (G) and a partial region of one or more pixels which are respectively adjacent to the defective pixel (G) and are of the same color (G). When the light scattering property imparted to the thermosensitive layer at regions 24b and 24c at the defective pixel regions is imparted up to positions which overlap partial regions of the one or more normal pixels which are adjacent to the defective pixel and which are of the same luminous color, when the one or more adjacent pixels emit light, the defective pixels appear as if they also emit light of the same color. Thus, the defective pixel may be made more inconspicuous.

The regions imparted with a light scattering state are not limited to the regions illustrated in FIG. 5. For example, a region corresponding to an entire or partial region of a defective pixel and a partial region of one or more pixels adjacent to the defective pixel may be imparted with a light scattering state. The thermosensitive layer may be imparted with a light scattering state up to a position that overlaps a partial region of one ore more pixels which are adjacent to a defective pixel (G) and have a luminous color (R or B) different from the luminous color of the defective pixel.

When the thermosensitive layer 24 arranged at the light extraction side is selectively imparted with a light scattering state through a process as described above, an organic EL display device 10 wherein a constantly non-lit defective pixel 22b is repaired, may be obtained. After repairing, the display device may undergo an examination to ensure completion (FIG. 3(F)).

According to the thus-produced organic EL display device 10, in the defective pixel 22b, light emitted from the adjacent pixels 22a and 22c is diffusely reflected to the thermosensitive layer 24 in a light scattering state. Thus, the defective pixel 22b is viewed as if it emits light. In other words, the defective pixel 22b picks up light emitted from the adjacent normal pixels 22a and 22c, so that the pixel 22b appears to emit light spontaneously. As a result, the constantly non-lit pixel may be made substantially inconspicuous. The display device thus becomes a display device wherein defects are apparently absent. Moreover, the particular content of the display does not readily allow defects to be seen, and thus the defects are inconspicuous regardless of the image displayed.

As described above, according to the invention, energy is applied externally to at least one member, preferably a thermosensitive layer, the state of which changes from a transparent state to a light scattering state when the layer is heated at a specified temperature or higher, arranged at the light extraction side of a defective pixel that is in a constantly non-lit state, so as to impart a light scattering property to the member. Thus, constantly non-lit pixels, which have not been easily repaired conventionally, may be substantially affected such that a defect thereof is not substantially recognized. This repairing method may be applied in spite the existence of a cause of the defect of the defective pixel. Thus, the defective pixel may easily be repaired at a low cost. Thus, according to the invention, the yield of display devices may be greatly improved and costs may be decreased. Accordingly, display devices high in quality may be provided at a low cost.

The display device and the method for repairing a defective pixel according to the invention have been described above; however, the invention is not limited to the above-mentioned exemplary embodiments. For example, the exemplary embodiment is concerned with a case where a thermosensitive layer, which is imparted with a light scattering state by heating the layer at a specified temperature or higher, is formed so that a light scattering property may be selectively imparted at the light extraction side of a defective pixel; however, it is not necessarily essential to form such a thermosensitive layer. For example, in a bottom emission display device, a flaw may be selectively made at a supporting substrate surface at a region thereof corresponding to a defective pixel by laser processing or the like, so as to impart a light scattering property to the surface. In a top emission display device, a flaw may be selectively made on a sealing member surface at a region thereof corresponding to a defective pixel, so as to impart a light scattering property to the surface.

The invention may be applied to any display device wherein pixels are arranged on a supporting substrate. The invention may also be applied to, for example, repair of defective pixels in a display device wherein inorganic EL elements, plasma elements, electrophoresis elements, liquid crystal elements or other pixels are arranged.

The foregoing description of the exemplary embodiments of the present invention has been provided for the purposes of illustration and description. It is not intended to be exhaustive or to limit the invention to the precise forms disclosed. Obviously, many modifications and variations will be apparent to practitioners skilled in the art. The exemplary embodiments were chosen and described in order to best explain the principles of the invention and its practical applications, thereby enabling others skilled in the art to understand the invention for various embodiments and with the various modifications as are suited to the particular use contemplated. It is intended that the scope of the invention be defined by the following claims and their equivalents.

All publications, patent applications, and technical standards mentioned in this specification are herein incorporated by reference to the same extent as if each individual publication, patent application, or technical standard was specifically and individually indicated to be incorporated by reference.

What is claimed is:

1. A display device, comprising:
  a supporting substrate;
  pixels with different respective luminous colors arranged over the supporting substrate; and
  a member which is arranged on the light extraction side of a defective pixel, the defective pixel being in a constantly non-lit state, the member being imparted with a light scattering property by the selective application of external energy,
  wherein the light scattering property is imparted up to a position which overlaps a partial region of one or more pixels adjacent to the defective pixel and having the same color as the defective pixel.

2. The display device of claim 1, wherein the pixels comprise an organic EL element.

3. The display device of claim 1, wherein the member arranged on the light extraction side of the defective pixel is a thermosensitive layer which changes from a transparent state to a light scattering state when the member is heated to a specified temperature or higher.

4. The display device of claim 3, wherein the thermosensitive layer is disposed over the whole of the area where the pixels are arranged.

5. The display device of claim 1, wherein the display device is an active matrix driving display device.

6. A method for repairing a defective pixel, comprising:
  performing an examination for specifying a defective pixel which is in a constantly non-lit state from among pixels arranged over a supporting substrate in a display device, in which pixels with different respective luminous colors are arranged over the supporting substrate; and
  applying external energy selectively to at least one member arranged on the light extraction side of the defective pixel specified by the examination, thereby imparting a light scattering property to the member, such that the light scattering property is imparted up to a position which overlaps a partial region of one or more pixels adjacent to the defective pixel and having the same color as the defective pixel.

7. The method for repairing a defective pixel of claim 6, wherein the selectively applied energy is heat.

8. The method for repairing a defective pixel of claim 6, wherein the selectively applied energy is a radiated laser ray.

9. The method for repairing a defective pixel of claim 6, further comprising processing a pixel which is in a constantly lit state, from among the pixels, such that it becomes a pixel in a constantly non-lit state, before the selective application of energy to the at least one member arranged on the light extraction side of the defective pixel, thereby imparting the light scattering property to the member.

10. A display device, wherein a defective pixel is repaired by the method of claim 6.

* * * * *